(12) United States Patent
Li et al.

(10) Patent No.: US 9,829,541 B2
(45) Date of Patent: Nov. 28, 2017

(54) METHOD FOR DISPLAYING TERMINAL CHARGING STATUS AND TERMINAL

(71) Applicant: Tencent Technology (Shenzhen) Company Limited, Guangdong (CN)

(72) Inventors: Li Li, Guangdong (CN); Ming Li, Guangdong (CN); Jiayi Yan, Guangdong (CN); Yuxi Liu, Guangdong (CN); Zhijun Zhang, Guangdong (CN); Haibo Xu, Guangdong (CN); Zhipeng Pan, Guangdong (CN); Xi Zhang, Guangdong (CN)

(73) Assignee: Tencent Technology (Shenzhen) Company Limited, Guangdong (CN)

( * ) Notice: Subject to any disclaimer, the term of this patent is extended or adjusted under 35 U.S.C. 154(b) by 362 days.

(21) Appl. No.: 14/636,286

(22) Filed: Mar. 3, 2015

(65) Prior Publication Data

US 2015/0177334 A1     Jun. 25, 2015

Related U.S. Application Data

(63) Continuation of application No. PCT/CN2013/082799, filed on Sep. 2, 2013.

(30) Foreign Application Priority Data

Sep. 25, 2012 (CN) .......................... 2012 1 0360806

(51) Int. Cl.
*G01R 31/36* (2006.01)
*H01M 10/48* (2006.01)
*H04M 1/725* (2006.01)

(52) U.S. Cl.
CPC ..... *G01R 31/3682* (2013.01); *G01R 31/3606* (2013.01); *G01R 31/3648* (2013.01);
(Continued)

(58) Field of Classification Search
None
See application file for complete search history.

(56) References Cited

U.S. PATENT DOCUMENTS 7,626,598 B2 * 12/2009 Manchester .......... G06F 1/1626
345/659
9,474,953 B1 * 10/2016 Duke ................. A63B 69/0071
(Continued)

OTHER PUBLICATIONS

ATT Z221 User Manual, V1.0, Jul. 2011.*

*Primary Examiner* — Joseph Schoenholtz
(74) *Attorney, Agent, or Firm* — Haug Partners LLP; William S. Frommer

(57) ABSTRACT

A method for displaying a terminal charging status and a terminal. The method includes: displaying a charging status region on a terminal screen when it is detected that a terminal battery is being charged, with a halo enlarging or shrinking with a preset frequency existing at the edge of the charging status region; according to a ratio of the current electric quantity of the terminal battery to the electric quantity of the terminal battery being fully charged, displaying a filled region having the same ratio in the charging status region. The method for displaying a terminal charging status and the terminal can realize visually displaying a charging status and a charging progress of the terminal.

15 Claims, 4 Drawing Sheets

(52) U.S. Cl.
CPC ..... *H01M 10/488* (2013.01); *H04M 1/72544* (2013.01); *H04M 1/72519* (2013.01)

(56) References Cited

U.S. PATENT DOCUMENTS

| | | | |
|---|---|---|---|
| 2005/0156882 A1* | 7/2005 | Manchester | G06F 1/1626 |
| | | | 345/158 |
| 2013/0069955 A1* | 3/2013 | Tristram | G06T 13/00 |
| | | | 345/473 |
| 2013/0069956 A1* | 3/2013 | Tristram | G06T 13/20 |
| | | | 345/473 |
| 2013/0316763 A1* | 11/2013 | Kader | H04M 1/72544 |
| | | | 455/556.1 |
| 2014/0073262 A1* | 3/2014 | Gutierrez | H04M 1/7253 |
| | | | 455/67.11 |
| 2015/0077438 A1* | 3/2015 | Tamaki | A44C 5/00 |
| | | | 345/672 |
| 2016/0141730 A1* | 5/2016 | Shin | H01M 10/4207 |
| | | | 429/7 |
| 2017/0003879 A1* | 1/2017 | Tamai | H04M 1/18 |

* cited by examiner

METHOD FOR DISPLAYING TERMINAL CHARGING STATUS AND TERMINAL

CROSS-REFERENCE TO RELATED APPLICATIONS

The present application is a Continuation Application of PCT Patent Application No. PCT/CN2013/082799, filed on Sep. 2, 2013, which claims the benefit of priority of China Patent Application No. 201210360806.2 filed in the Chinese Patent Office on Sep. 25, 2012, and entitled "METHOD FOR DISPLAYING TERMINAL CHARGING STATUS AND TERMINAL", the contents of which are hereby incorporated by reference in their entireties.

FIELD

The present disclosure relates to the field of electronic technologies, and more particularly to a method for displaying a charging status and a terminal.

BACKGROUND

With the continuous development of electronic technology, a mobile terminal (such as a smart phone, PDA (personal digital assistant)) has been used increasingly in people's daily life. In the process of the use of the mobile terminal, with the continuous decrease of the energy of a terminal battery of the mobile terminal, it is indispensable to charge the terminal battery and learn a charging progress of the terminal battery. However, in the existing technology, the existing mobile terminal usually can only display its charging status by means of indicator lights or characters, which obviously cannot indicate a current charging status and a current charging progress of the mobile terminal, and also cannot clearly distinguish between a being charged status and a fully charged status.

SUMMARY

In the existing technology, the way of displaying the charging status of a terminal by means of indicator lights or characters cannot visually indicate a current charging status a current charging progress of the mobile terminal, and also cannot clearly distinguish between a being charged status and a fully charged status.

In order to solve the problem in the existing technology, a method for displaying terminal charging status and a terminal are provided in the present disclosure, which can realize visually displaying a current charging status and a charging progress on a display screen of the terminal. Technical proposals are described as the following.

A method for displaying charging status, including:

displaying a charging status region on a terminal screen when it is detected that a terminal battery is being charged, with a halo enlarging or shrinking with a preset frequency existing at the edge of the charging status region; and according to a ratio of a current electric quantity of the terminal battery to an electric quantity of the terminal battery being fully charged, displaying a filled region having the same ratio in the charging statue region.

Accordingly, according to another aspect of the present disclosure, a terminal is provided, the terminal includes:

a charging status displaying module, configured to display a charging status region on a terminal screen when it is detected that a terminal battery is being charged, with a halo enlarging or shrinking with a preset frequency existing at the edge of the charging status region; and an electric quantity display module, configured to, according to a ratio of a current electric quantity of the terminal battery to the electric quantity of the terminal battery being fully charged, display a filled region having the same ratio in the charging statue region.

In summary, according to the technical solutions of the method for displaying terminal charging status and the terminal above described, the charging stats region is displayed on the terminal screen of the terminal, and a percentage of filled region in the charging status region is displayed on the terminal screen according to the current electric quantity of the terminal battery being charged. Thus, the charging status and the charging progress of the terminal are visually displayed on the terminal screen, and the time required to complete charging the terminal battery is easily obtained, so that the user can learn the charging progress of the terminal in advance, and arrange the life and work plan.

BRIEF DESCRIPTION OF THE DRAWINGS

In order to make embodiments of present disclosure more clearly, the drawings which are needed in the embodiments of present disclosure are described simply as follows. It is obviously, the drawings described as the follows are only exemplary embodiments of present disclosure. To a person of ordinary skill in the art, under premise of no creative work, other drawings may be obtained according to the drawings.

DETAILED DESCRIPTION OF ILLUSTRATED EMBODIMENTS

Embodiments of the present invention provide a data processing method, which can reduce play time delay of audio file or video file. Correspondingly, the present invention further provides a data processing device. Introductions and descriptions in the following content will be respectively illustrated in detail.

Figure 1:
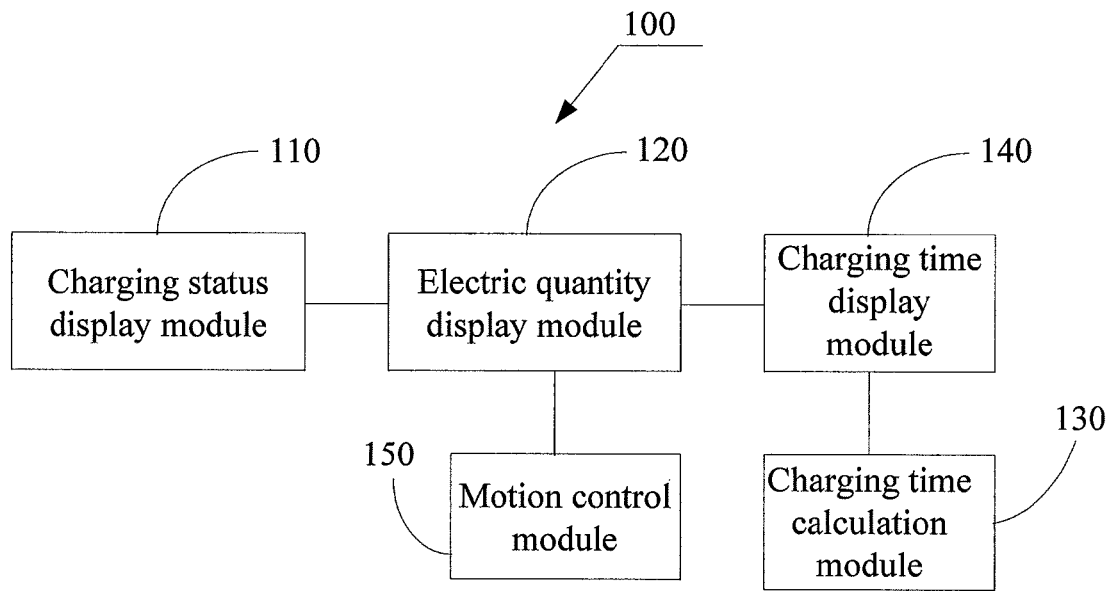
FIG. 1 is a schematic diagram of a terminal provided in an embodiment of present disclosure.

Referring to FIG. 1, FIG. 1 is a schematic diagram of a terminal provided in an embodiment of present disclosure. The terminal provided in the present disclosure in FIG. 1 can be, but not limited to: a laptop, a mobile phone, a tablet, an e-reader, a PND (portable navigation device), a PDA (personal digital assistant) or other mobile terminals. In one embodiment of the present disclosure, as shown in FIG. 1, the terminal 100 at least includes: a charging status displaying module 110 and an electric quantity display module 120 electrically connected to the charging status displaying module 110.

Figure 3:
FIG. 3 is an effect diagram for displaying a charging status of the terminal provided in an embodiment of present disclosure.

The charging status displaying module 110 is configured to display a charging status region on a terminal screen when it is detected that a terminal battery is being charged, with a halo enlarging or shrinking with a preset frequency existing at the edge of the charging status region. The charging status region and the halo at the edge of the charging status region are taken here as an example as shown in FIG. 3, it is an effect diagram for displaying a charging status of the terminal 100 provided in an embodiment of present disclosure, wherein, the shape of the halo can be circular, and a region surrounded by the halo is the charging status region. The size and/or the width of the halo can enlarge or shrink with a preset frequency, so as to realize a dynamic effect of the charging status region with the halo enlarging or shrinking like a dynamic effect of "breathing", which indicates that the terminal 100 is being charged. It should be understood that the halo enlarging can be defined as a dynamic effect of "breathing-out", and the halo shrinking can be defined as a dynamic effect of "breathing-in". Thus, when it is detected that the terminal battery is fully charged or fails to being charged, the dynamic effect of "breathing" correspondingly stops. In addition, the charging status region can only be showed up when the terminal 100 is in a lock-screen mode, so that when a user unlocks and operates the terminal 100, the charging states region will not be displayed on the terminal screen.

In another embodiment of the present disclosure, the halo is not just limited to be circular, and also can be any shape of oval, triangle, rectangle and trapezoid. Accordingly, the charging status region surrounded by the halo is not just limited to be circular, which also can be any shape of oval, triangle, rectangle and trapezoid.

The electric quantity display module 120 is configured to, according to a ratio of a current electric quantity of the terminal battery to the electric quantity of the terminal battery being fully charged (i.e., the ratio of the current electric quantity of the terminal battery having been charged to the capacity of the terminal battery), display a filled region having the same ratio in the charging statue region. In one embodiment of the present disclosure, for example, the electric quantity of the terminal battery being fully charged is about 1000 mAh, that is, the capacity of the terminal battery is 1000 mAh, when it is detected that the current electric quantity of the terminal battery is about 230 mAh, then the ratio of the current electric quantity of the terminal battery to the electric quantity of the terminal battery being fully charged is about 23%. Thus, a filled region having the same ratio is displayed in the charging statue region, namely, the ratio of the filled region to the charging status region is about 23%. As shown in FIG. 3, the above-mentioned ratio of 23% can be displayed in the charging status region of the terminal screen in real time, so as to make the user visually know the charging progress of the terminal 100. With the continual change of the current electric quantity of the terminal battery, accordingly the ratio will be dynamically increase or decrease. When the terminal battery is fully charged, the filled region can fill the charging status region.

Optionally, in one embodiment of the present disclosure, the terminal 100 can also include: a charging time calculation module 130 and a charging time display module 140 electrically connected to the charging time calculation module 130.

The charging time calculation module 130 is configured to calculate the rest of charging time till the terminal battery is fully charged according to a current charging electric current, the capacity of the terminal battery and the power consumption of the terminal 100. In the embodiment of the present disclosure, in detail, the charging time calculation module 130 can be configured to figure out current power consumption of the terminal 100 according to the service condition of each function modules (such as a terminal, a Wi-Fi module, and a GSM module, etc.) of the terminal 100. For example, assuming that the current power consumption of the terminal 100 is about 2.035 W (watt), and the rated voltage of the terminal 100 is about 3.7V (volt), then the current of the terminal 100 is about 550 mA (milliampere) (i.e., 2.035/3.7=0.55 A=550 mA). It is detected that a current charging electric current is about 650 mA, therefore, the rest of charging time can be figured out: (1000 mAh-230 mAh)/(650 mA-550 mA)=7.7 hours.

The charging time display module 140 is configured to display the rest of charging time calculated by the charging time calculation module 130. As shown in FIG. 3, in the embodiment of the present disclosure, a character on the terminal screen is used here to display the rest of charging time. Understandably, the rest of charging time can also be displayed in the form of an animation.

Further optional, in another embodiment of the present disclosure, the terminal 100 can also include a motion control module 150, which is electrically connected to the electric quantity display module 120.

Figure 5:
FIG. 5 is an effect diagram of a steady state after a movement of the filled region in the charging status region according to an angle of inclination of the terminal provided in an embodiment of the present disclosure.

The motion control module 150 is configured to control movements of the filled region in the charging status region according to different angles in inclination of the terminal 100. In the embodiment of the present disclosure, in detail, the motion control module 150 is configured to move the filled region according to different angles in inclination of the terminal 100, to keep the filled region in the gravity direction of the charging status region. It should be understood that, the charging status region can be considered as a sealed container, and the filled region can be seen as "fluid" in the sealed container, so that the "fluid" moves when the terminal 100 incline to different angles. As shown in FIG. 5, FIG. 5 is an effect diagram of a steady state after a movement of the filled region in the charging status region according to an angle of inclination of the terminal provided in an embodiment of the present disclosure. With the movement and inclination of the terminal 100, the filled region is always kept in the gravity direction of the charging status region, which enables the user to observe the filled region with a better viewing angle, thereby more visually obtaining the charging progress (such as the rest of charging time, a charging ratio) of the terminal 100.

In another embodiment of the present disclosure, the motion control module 150 can also be configured to control the filled region to simulate the movement of "liquid" in the charging status region, that is, the motion control module 150 can control the movement of the filled region in the charging status region in the way of simulating the movement of "liquid" in the charging status region. For example, in detail, a mobile phone as shown in FIG. 5 is taken here as an example, the charging status region is a circular area, an acceleration sensor of the mobile phone can detect the gravity components of adjacent two frames along the screen of the mobile phone. Assuming that the mobile phone is placed in vertical, a horizontal frame can be defined as an X frame, and a vertical frame adjacent to the horizontal frame can be defined as a Y frame, when the mobile phone tilts, the gravity components along the X frame and the Y frame are x and y, respectively; by using a function of arctan 2(y, x), an angle $\theta$ of inclination can be obtained by projecting the screen to a vertical plane, namely, an included angle $\theta$ between the screen and a vertical direction (i.e., the direction of gravitational acceleration). One of the scopes of the included angle θ is (−180, 180], that is, the included angle is greater than −180°, and less than or equal to 180°. A movement speed v of the filled region in the charging status region can be figured out by using a formula (1):

$$v = v_0 + (1-\mu) \cdot \Delta a \times t. \quad (1)$$

Wherein, v is the movement speed, $v_0$ is an initial velocity, and Δa is the acceleration, and μ is a preset resistance coefficient whose scope is (0, 1), and t is a preset refresh time, such as 0.04 seconds, 0.05 seconds. In the embodiment of the present disclosure, the acceleration Δa meets a formula (2) as follows:

$$\begin{cases} \Delta a = g \cdot \sin\theta \ \ldots \ , & |\theta| < 90° \\ \Delta a = g \ \ldots \ , & |\theta| >= 90° \end{cases} \quad (2)$$

According to the formulas (1) and (2), when the motion control module 150 controls the filled region to move in the charging status region, then the filled region as a whole can move along the edge of the charging status region and simulate the movement of a simple pendulum. Thus, an angular velocity can be correspondingly calculated according to the movement speed obtained from the formula (1) and the radius of the circular charging status region. The angular velocity in combination with the refresh time t, the position of the filled region in the charging status region can be determined corresponding every refresh time. Since the resistance coefficient is not zero, so after a period of simple pendulum of the filled region, the filled region will stop in a steady state as shown in FIG. 5.

The terminal is described in detail according to the embodiments of the present disclosure.

A method for displaying terminal charging status is provided according to another embodiment of the present disclosure.

Figure 2:
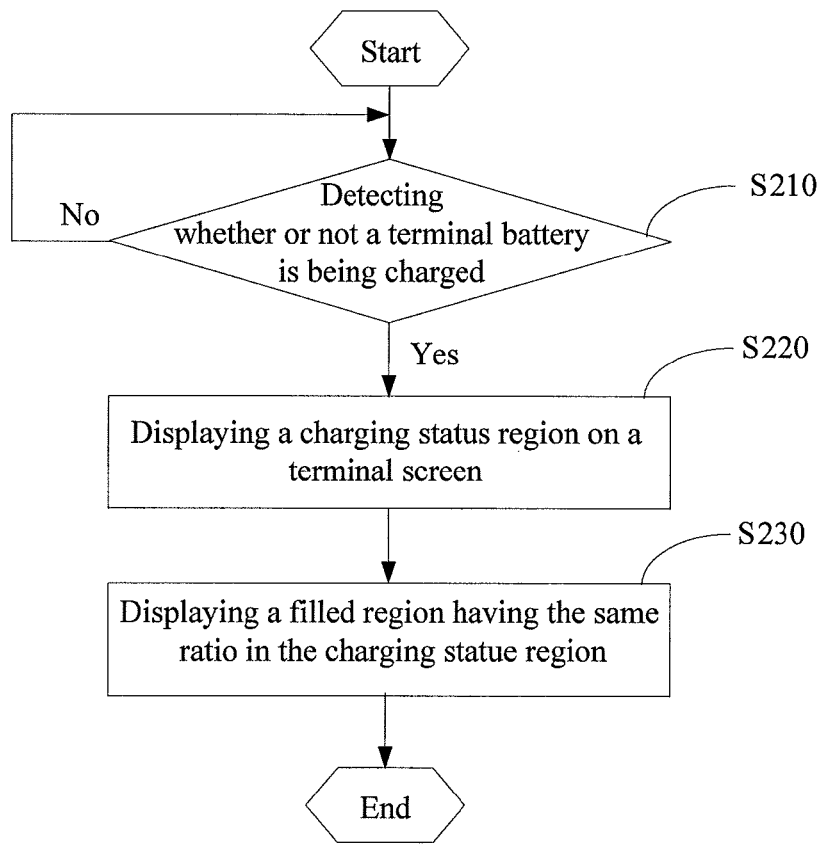
FIG. 2 is a flowchart of a method for displaying terminal charging status provided in an embodiment of present disclosure.

Referring to FIG. 2, FIG. 2 is a flowchart of a method for displaying terminal charging status provided in an embodiment of present disclosure. The method of the embodiment can be implemented and realized by using the above-mentioned terminal of the embodiment of the present disclosure. As shown in FIG. 2, the method for displaying terminal charging status at least includes the following steps.

In step S201, detecting whether or not a terminal battery is being charged.

In step S202, displaying a charging status region on a terminal screen when it is detected that a terminal battery is being charged, with a halo enlarging or shrinking with a preset frequency existing at the edge of the charging status region.

The charging status region and the halo at the edge of the charging status region are taken here as an example as shown in FIG. 3, FIG. 3 is an effect diagram for displaying a charging status of the terminal provided in an embodiment of present disclosure, wherein, the shape of the halo can be circular, and a region surrounded by the halo is the charging status region. The size and/or the width of the halo can enlarge or shrink with a preset frequency, so as to realize a dynamic effect of the charging status region with the halo enlarging or shrinking like a dynamic effect of "breathing", which indicates that the terminal is being charged. It should be understood that the halo enlarging can be defined as a dynamic effect of "breathing-out", and the halo shrinking can be defined as a dynamic effect of "breathing-in". Thus, when it is detected that the terminal battery is fully charged or fails to being charged, the dynamic effect of "breathing" correspondingly stops. In addition, the charging status region can only be showed up when the terminal is in a lock-screen mode, so that when a user unlocks and operates the terminal, the charging states region will not be displayed on the terminal screen.

In another embodiment of the present disclosure, the halo is not just limited to be circular, and also can be any shape of oval, triangle, rectangle and trapezoid. Accordingly, the charging status region surrounded by the halo is not just limited to be circular, which also can be any shape of oval, triangle, rectangle and trapezoid.

In step S203, according to a ratio of a current electric quantity of the terminal battery to an electric quantity of the terminal battery being fully charged (i.e., the ratio of the current electric quantity of the terminal battery having been charged to the capacity of the terminal battery), displaying a filled region having the same ratio in the charging statue region.

In one embodiment of the present disclosure, for example, the electric quantity of the terminal battery being fully charged is about 1000 mAh, that is, the capacity of the terminal battery is 1000 mAh, when it is detected that the current electric quantity of the terminal battery is about 230 mAh, then the ratio of the current electric quantity of the terminal battery to the electric quantity of the terminal battery being fully charged is about 23%. Thus, a filled region having the same ratio is displayed in the charging statue region, namely, the ratio of the filled region to the charging status region is about 23%. As shown in FIG. 3, the above-mentioned ratio of 23% can be displayed in the charging status region of the terminal screen in real time, so as to make the user visually know the charging progress of the terminal. With the continual change of the current electric quantity of the terminal battery, accordingly the ratio will be dynamically increase or decrease. When the terminal battery is fully charged, the filled region can fill the charging status region.

Optionally, in one embodiment of the present disclosure, the method for displaying terminal charging status also includes the following step:

calculating the rest of charging time till the terminal battery is fully charged according to a current charging electric current, the capacity of the terminal battery and the power consumption of the terminal; and displaying the rest of charging time.

In the embodiment of the present disclosure, in detail, the charging time calculation module 130 can be configured to figure out current power consumption of the terminal according to the service condition of each function modules (such as a terminal, a Wi-Fi module, and a GSM module, etc.) of the terminal. For example, assuming that the current power consumption of the terminal is about 2.035 W (watt), and the rated voltage of the terminal is about 3.7V (volt), then the current of the terminal is about 550 mA (milliampere) (i.e., 2.035/3.7=0.55 A=550 mA). It is detected that a current charging electric current is about 650 mA, therefore, the rest of charging time can be figured out: (1000 mAh-230 mAh)/(650 mA-550 mA)=7.7 hours. As shown in FIG. 3, in the embodiment of the present disclosure, a character on the terminal screen is used here to display the rest of charging time. Understandably, the rest of charging time can also be displayed in the form of an animation.

Figure 4:
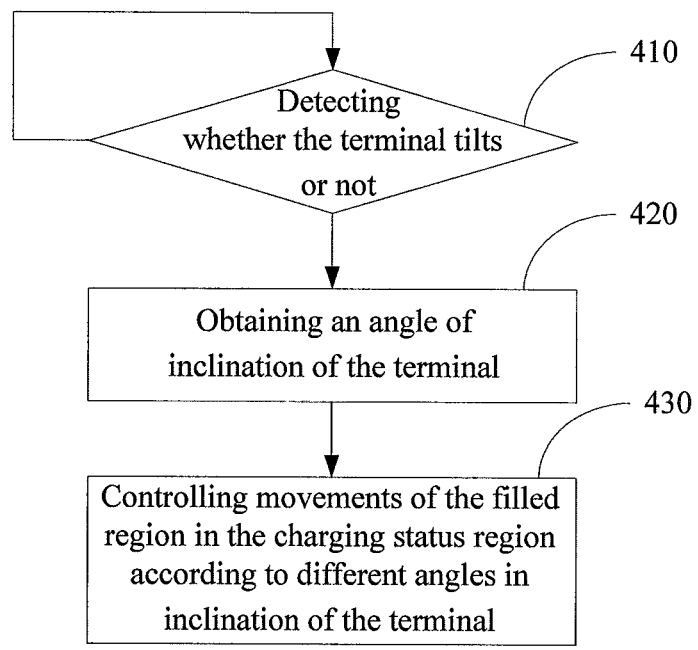
FIG. 4 is a flowchart of a method for controlling the movement of a filled region in a charging status region according to an angle of inclination of the terminal provided in an embodiment of the present disclosure.

Furthermore, the method for displaying terminal charging status according to an embodiment of the present disclosure further includes steps for controlling the movement of a filled region in a charging status region according to an angle of inclination of the terminal as shown in FIG. 4.

In step S401, detecting whether the terminal tilts or not.

In an embodiment of the present disclosure, in detail, a mobile phone as shown in FIG. 5 is taken here as an example, FIG. 5 is an effect diagram of a steady state after a movement of the filled region in the charging status region according to an angle of inclination of the terminal provided in an embodiment of the present disclosure. The charging status region is a circular area; an acceleration sensor of the mobile phone can detect the gravity components of adjacent two frames along the screen of the mobile phone. Assuming that the mobile phone is placed in vertical, a horizontal frame can be defined as an X frame, and a vertical frame adjacent to the horizontal frame can be defined as a Y frame, when the mobile phone tilts, the gravity components along the X frame and the Y frame are x and y, respectively, which is detected by the acceleration sensor. If the gravity component along the X frame is not equal to 0, then the terminal tilts; if the gravity component along the X frame is equal to 0, which means the terminal does not tilt.

In step S402, obtaining an angle of inclination of the terminal.

In an embodiment of the present disclosure, in detail, when the mobile phone tilts, the gravity components along the X frame and the Y frame are x and y, respectively; by using a function of arctan 2(y, x), an angle θ of inclination can be obtained by projecting the screen to a vertical plane, namely, an included angle θ between the screen and a vertical direction (i.e., the direction of gravitational acceleration), and one of the scopes of the included angle θ is (−180, 180], that is, the included angle is greater than −180°, and less than or equal to 180°.

In step S403, controlling movements of the filled region in the charging status region according to different angles in inclination of the terminal.

In an embodiment of the present disclosure, in detail, by moving the filled region according to different angles in inclination of the terminal, the filled region is kept in the gravity direction of the charging status region. It should be understood that, the charging status region can be considered as a sealed container, and the filled region can be seen as "fluid" in the sealed container, so that the "fluid" moves when the terminal incline to different angles. As shown in FIG. 5, with the movement and inclination of the terminal, the filled region is always kept in the gravity direction of the charging status region, which enables the user to observe the filled region with a better viewing angle, thereby more visually obtaining the charging progress (such as the rest of charging time, a charging ratio) of the terminal.

In another embodiment of the present disclosure, the filled region can be controlled to simulate the movement of "liquid" in the charging status region, that is, the movement of the filled region in the charging status region can be controlled in the way of simulating the movement of "liquid" in the charging status region. For example, in detail, a mobile phone as shown in FIG. 5 is taken here as an example, the charging status region is a circular area, the filled region as a whole can move along the edge of the charging status region and simulate the movement of a simple pendulum. A movement speed v of the filled region in the charging status region can be figured out by using a formula (1):

$$v = v_0 + (1-\mu) \cdot \Delta a \times t. \quad (1)$$

Wherein, v is the movement speed, $v_0$ is an initial velocity, and $\Delta a$ is the acceleration, and $\mu$ is a preset resistance coefficient whose scope is (0, 1), and t is a preset refresh time, such as 0.04 seconds, 0.05 seconds. In the embodiment of the present disclosure, the acceleration $\Delta a$ meets a formula (2) as follows:

$$\begin{cases} \Delta a = g \cdot \sin\theta \ldots, & |\theta| < 90° \\ \Delta a = g \ldots, & |\theta| >= 90° \end{cases} \quad (2)$$

According to the formulas (1) and (2), an angular velocity can be calculated according to the movement speed obtained from the formula (1) and the radius of the circular charging status region. The angular velocity in combination with the refresh time t, the position of the filled region in the charging status region can be determined corresponding every refresh time. Since the resistance coefficient is not zero, so after a period of simple pendulum of the filled region, the filled region will stop in a steady state as shown in FIG. 5.

In one embodiment of the present disclosure, each step of the method for displaying terminal charging status according to the embodiment as shown in FIG. 2 can be implemented by each functional unit of the terminal as shown in FIG. 1. For example, the steps S201 and S220 in FIG. 2 can be implemented by the charging status display module 110 of the terminal 100 in FIG. 1; the step S230 can be implemented by the electric quantity display module 120 of the terminal 100 in FIG. 1; each step of the method for controlling the movement of a filled region in a charging status region according to an angle of inclination of the terminal in FIG. 4 can also be implemented by each functional unit of the terminal as shown in FIG. 1. For example, the step S430 in FIG. 4 can be implemented by the motion control module 150 as shown in FIG. 1.

According to another embodiment, each functional unit of the terminal in FIG. 1 can be all or partly combined into one or a plurality of other functional units, or one (some) of the function units can also be divided into multiple smaller sub-units functionally, which can achieve the same operation, without affecting the realization and implementation of technical effect of the embodiments of the present disclosure. The above-mentioned functional units are divided based on the logic function, in practice, the function of a functional unit can be achieved by the combination of multiple functional units, or the functions of multiple functional units can be achieved by one functional unit. In other embodiments of the present disclosure, the terminal can also include other modules. But in the practical application, these functions can also be implemented with the assistance of other functional unit, or be achieved in collaboration with multiple functional units.

In addition, in one embodiment, the terminal may further include a storage, and one or more programs, the one or more programs stored in the storage for execution by one or more processors, the one or more programs including instructions for performing the following steps:

detecting whether or not a terminal battery is being charged;

displaying a charging status region on a terminal screen when it is detected that a terminal battery is being charged, with a halo enlarging or shrinking with a preset frequency existing at the edge of the charging status region; and according to a ratio of a current electric quantity of the terminal battery to an electric quantity of the terminal battery being fully charged (i.e., the ratio of the current electric quantity of the terminal battery having been charged to the capacity of the terminal battery), displaying a filled region having the same ratio in the charging statue region.

Optionally, in one embodiment of the present disclosure, the one or more programs including instructions for performing the following step:

calculating the rest of charging time till the terminal battery is fully charged according to a current charging electric current, the capacity of the terminal battery and the power consumption of the terminal; and displaying the rest of charging time.

Optionally, in one embodiment of the present disclosure, the one or more programs including instructions for performing the following step:

controlling movements of the filled region in the charging status region according to different angles in inclination of the terminal.

Optionally, in one embodiment of the present disclosure, the one or more programs including instructions for performing the following step:

controlling the movement of the filled region in the charging status region in the way of simulating the movement of "liquid" in the charging status region.

In summary, according to the embodiments of the method for displaying terminal charging status and the terminal above described, the charging stats region is displayed on the terminal screen of the terminal, and a percentage of filled region in the charging status region is displayed on the terminal screen according to the current electric quantity of the terminal battery being charged. Thus, the charging status and the charging progress of the terminal are visually displayed on the terminal screen, and the time required to complete charging the terminal battery is easily obtained, so that the user can learn the charging progress of the terminal in advance, and arrange the life and work plan.

A person having ordinary skills in the art can realize that part or whole of the processes in the method for displaying terminal charging status as shown in FIG. 2 according to the above embodiments may be implemented by a computer program instructing relevant hardware in the terminal as shown in FIG. 1. The program may be stored in a computer readable storage medium. When executed, the program may execute processes in the above-mentioned embodiments of methods. The storage medium may be a magnetic disk, an optical disk, a Read-Only Memory (ROM), a Random Access Memory (RAM), et al.

Although certain embodiments of the present disclosure have been specifically described, the present disclosure is not to be construed as being limited thereto. Various changes or modifications may be made to the present disclosure without departing from the scope and spirit of the present disclosure.

What is claimed is:

1. A method for displaying terminal charging status, comprising:

displaying a charging status region on a terminal screen when it is detected that a terminal battery is being charged, with a halo enlarging or shrinking with a preset frequency existing at the edge of the charging status region, wherein, the charging status region is displayed only when the terminal screen is in a lock-screen mode, and the charging status region is not displayed on the terminal screen when the terminal screen is unlocked and operated;

according to a ratio of a current electric quantity of the terminal battery to an electric quantity of the terminal battery being fully charged, displaying a filled region having the same ratio in the charging status region; and controlling movements of the filled region in the charging status region according to different angles in inclination of the terminal.

2. The method for displaying terminal charging status according to claim 1, further comprising:

calculating the rest of charging time till the terminal battery is fully charged according to a current charging electric current, the capacity of the terminal battery and the power consumption of the terminal; and displaying the rest of charging time.

3. The method for displaying terminal charging status according to claim 2, wherein the rest of charging time till the terminal battery is fully charged is figured out according to a current charging electric current, the capacity of the terminal battery and the power consumption of the terminal.

4. The method for displaying terminal charging status according to claim 1, wherein, the step of controlling movements of the filled region in the charging status region according to different angles in inclination of the terminal, comprises:

detecting whether or not the terminal tilts; and obtaining the angles in inclination of the terminal, wherein, an acceleration sensor in the terminal detects whether or not the terminal tilts, and obtains the angles in inclination of the terminal;

wherein the filled region is kept in the direction of gravity of the charging status region and moving the filled region according to different angles in inclination of the terminal.

5. The method for displaying terminal charging status according to claim 4, wherein the step of controlling movements of the filled region in the charging status region according to different angles in inclination of the terminal, further comprises:

controlling the movement of the filled region in the charging status region in the way of simulating the movement of "liquid" in the charging status region.

6. The method for displaying terminal charging status according to claim 4, wherein the charging status region is a shape selected from the shape consisting of oval, round, triangle, rectangle and trapezoid.

7. The method for displaying terminal charging status according to claim 6, wherein the charging status region is a circular area, the filled region as a whole moves along the edge of the charging status region and simulates the movement of a simple pendulum.

8. The method for displaying terminal charging status according to claim 6, wherein the step of controlling movements of the filled region in the charging status region according to different angles in inclination of the terminal, comprises:

controlling a movement speed of the filled region in the charging status region, wherein the movement speed is $v=v_0+(1-\mu)\cdot\Delta a \times t$, $v0$ is an initial velocity, and $\Delta a$ is the acceleration, and $\mu$ is a preset resistance coefficient whose scope is $(0, 1)$, and t is a preset refresh time, and $\theta$ is an angle of inclination can be obtained by projecting the screen to a vertical plane, and the acceleration $\Delta a$ meets:

$$\begin{cases} \Delta a = g \cdot \sin\theta \ldots, & |\theta| < 90° \\ \Delta a = g \ldots, & |\theta| >= 90° \end{cases}.$$

9. A terminal, comprising:
a memory storing a plurality of program codes; and a processor configured to execute the plurality of program codes for:

displaying a charging status region on a terminal screen when it is detected that a terminal battery is being charged, with a halo enlarging or shrinking with a preset frequency existing at the edge of the charging status region;

according to a ratio of a current electric quantity of the terminal battery to the electric quantity of the terminal battery being fully charged, displaying a filled region having the same ratio in the charging status region;

controlling movements of the filled region in the charging status region according to different angles in inclination of the terminal, comprising:

detecting whether or not the terminal tilts; and obtaining the angles in inclination of the terminal, wherein, an acceleration sensor in the terminal detects whether or not the terminal tilts, and obtains the angles in inclination of the terminal; and wherein the filled region is kept in the direction of gravity of the charging status region by moving the filled region according to different angles in inclination of the terminal.

10. The terminal according to claim 9, wherein the processor is further configured to execute the plurality of program codes for:

calculating the rest of charging time till the terminal battery is fully charged according to a current charging electric current, the capacity of the terminal battery and the power consumption of the terminal; and displaying the rest of charging time.

11. The terminal according to claim 10, wherein the rest of charging time till the terminal battery is fully charged is figured out according to a current charging electric current, the capacity of the terminal battery and the power consumption of the terminal.

12. The terminal according to claim 9, wherein the processor is configured to execute the plurality of program codes for controlling movements of the filled region in the charging status region according to different angles in inclination of the terminal in the way of simulating the movement of "liquid" in the charging status region.

13. The terminal according to claim 9, wherein the charging status region is a shape selected from the shape consisting of oval, round, triangle, rectangle and trapezoid.

14. The terminal according to claim 13, wherein the charging status region is a circular area, the filled region as a whole moves along the edge of the charging status region and simulates the movement of a simple pendulum.

15. The terminal according to claim 9, wherein the processor is further configured to execute the plurality of program codes for:

controlling a movement speed of the filled region in the charging status region, wherein the movement speed is $v = v_0 + (1-\mu) \cdot \Delta a \times t$, $v0$ is an initial velocity, and $\Delta a$ is the acceleration, and $\mu$ is a preset resistance coefficient whose scope is $(0, 1)$, and t is a preset refresh time, and $\theta$ is an angle of inclination can be obtained by projecting the screen to a vertical plane, and the acceleration $\Delta a$ meets:

$$\begin{cases} \Delta a = g \cdot \sin\theta \ldots, & |\theta| < 90° \\ \Delta a = g \ldots, & |\theta| >= 90° \end{cases}.$$

\* \* \* \* \*